United States Patent [19]

Milovancevic

[11] Patent Number: 4,977,590

[45] Date of Patent: Dec. 11, 1990

[54] SIGNAL LEVEL EXPANSION APPARATUS AS FOR A TELECOMMUNICATIONS SYSTEM

[75] Inventor: Slavko Milovancevic, Mesa, Ariz.

[73] Assignee: Executone Information Systems, Inc., Scottsdale, Ariz.

[21] Appl. No.: 358,245

[22] Filed: May 26, 1989

[51] Int. Cl.$^5$ .............................................. H04M 1/60
[52] U.S. Cl. ........................................ 379/395; 381/94
[58] Field of Search .................. 333/14; 381/169, 191, 381/94, 102, 104, 106, 107, 108, 109, 111, 113, 114, 115, 120, 121, 122, 154, 155, 162, 188, 205; 379/391, 395

[56] References Cited

U.S. PATENT DOCUMENTS

| | | | |
|---|---|---|---|
| Re. 28,426 | 5/1975 | Dolby | 333/14 |
| 3,895,322 | 7/1975 | Stewart et al. | 333/14 |
| 3,947,646 | 3/1976 | Saito | 381/169 X |
| 4,117,275 | 9/1978 | Miyanaga et al. | 381/191 X |
| 4,434,329 | 2/1984 | Nasu | 381/169 |

OTHER PUBLICATIONS

AT&T Data Sheet, LB1026AA, LB1026AB Voice Frequency Level Expanders, Jun. 1986.

AT&T Data Sheet, LB1068AW Universal Voice-Signal Conditioner, Mar. 1987.

Walker Equipment Corporation Advertisement, Feb. 1988.

Primary Examiner—James L. Dwyer
Assistant Examiner—Magdy Shehata
Attorney, Agent, or Firm—Ratner & Prestia

[57] ABSTRACT

A signal level expansion system for use in a telephone device is described which includes a level expansion circuit and an optional microphone enclosure. The circuit includes a voltage divider circuit which is used as a variable attenuator. The voltage divider has a junction field effect transistor (JFET) in its takeoff leg. The signal provided by the voltage divider is applied to an amplifier and then fed to a switch which detects voice signals. When a voice signal is detected having a level above a predetermined threshold, a timing circuit is energized. The timing circuit is connected to the JFET and, when energized, tends to increase the resistance in the takeoff leg of the voltage divider, increasing the signal level applied to the amplifier. The microphone enclosure surrounds the sides of the microphone with layers of rigid and resilient materials. These materials tend to attenuate all sound signals except those incident on the top of the microphone, which is positioned to receive speech signals from a user.

13 Claims, 4 Drawing Sheets

SIGNAL LEVEL EXPANSION APPARATUS AS FOR A TELECOMMUNICATIONS SYSTEM

FIELD OF THE INVENTION

The present invention relates generally to circuitry having a signal level expansion factor that changes in response to the level of its input signal and in particular, to such circuitry suitable for use in a telecommunications system.

BACKGROUND OF THE INVENTION

Conversing by telephone in a noisy environment can be both difficult and annoying Interfering background noise may be transmitted with the voice signal to the person being called and fed back to the caller. Consequently, person being called may hear speech intermingled with the background noise and, since the callers voice is fed back to his receiver, he may hear a mixture of noise and voice in one ear and noise in the other ear. The channel by which noise and speech are fed back to the receiver of a telephone is called the sidetone path. As used herein, the term "sidetone" refers to that portion of an audio spectrum, including the speaker's voice, which is purposely fed back from the microphone to the receiver of a handset to assure the speaker that the line is not "dead" and to help the speaker to find a desirable voice level.

Recent to advances in technology have made this problem more acute One of these technological changes is the mechanical design of the handset. Modern handsets are not as restrictive as earlier handsets in directing sound to the microphone. This loosened restriction allows greater mouth-to-microphone angles and distances for normal conversation but it also renders the telephone more susceptible to interference caused by relatively loud background noise.

Another recent change is the use of an electret microphone instead of a carbon microphone in the handset. The sensitivity of a carbon microphone is non-linear with respect to signal level for low level signals. An electret microphone, on the other hand, exhibits a substantially linear relationship between sensitivity and signal level. Thus, an electret microphone is more likely than a carbon microphone to pick-up interfering background noise.

This problem has been addressed in the past by AT&T in the their LB1026AA, LB1026AB and LB1068AW integrated circuits. Each of these circuits includes a gain expanding preamplifier which attenuates background noise, in pauses between speech, by approximately 10 decibels (dB). These circuits have a relatively complex design, including a preamplifier, a four-quadrant multiplier and an output amplification stage.

SUMMARY OF THE INVENTION

The present invention is embodied in a signal level expansion circuit. The circuit includes a variable attenuator which is coupled to receive the output signals provided by a microphone. Signals provided by the attenuator are applied to an amplifier which produces the output signal of the level expansion circuit. A level detecting circuit, which is coupled to receive this output signal, detects signals having amplitudes greater than a threshold and generates a control signal that conditions the attenuator to reduce the level of attenuation applied to the signals provided by the microphone.

According to a further aspect of the invention, a mounting apparatus is provided for the microphone which increases its directionality and, so, further reduces the susceptibility of the telephone device to interference caused by background noise.

DETAILED DESCRIPTION

The present invention is embodied in a relatively simple signal level expansion circuit In the embodiment presented below, this circuitry is described in the context of a telephone circuit which includes an electret microphone. However, a much wider range of applications is contemplated for this circuit. For example, it is contemplated that circuitry such as that described below could be used to implement a voice controlled switch (VOX), a squelch system operable in the ultrasound frequency band or in radio frequency bands or other similar applications.

In general terms, this circuitry operates as follows. Signals provided by an electret microphone are applied to a signal level expansion circuit and an amplifier circuit which are coupled to drive a telephone line. The signal level expansion circuitry passes the signals provided by the microphone when a speaker is talking into the microphone. When the speaker stops talking, the expansion circuitry greatly attenuates any background noise so that it is not sent to the person on the other end of the line and does not interfere, via the sidetone path, with the voice signals being fed back to the speaker.

Figure 1:
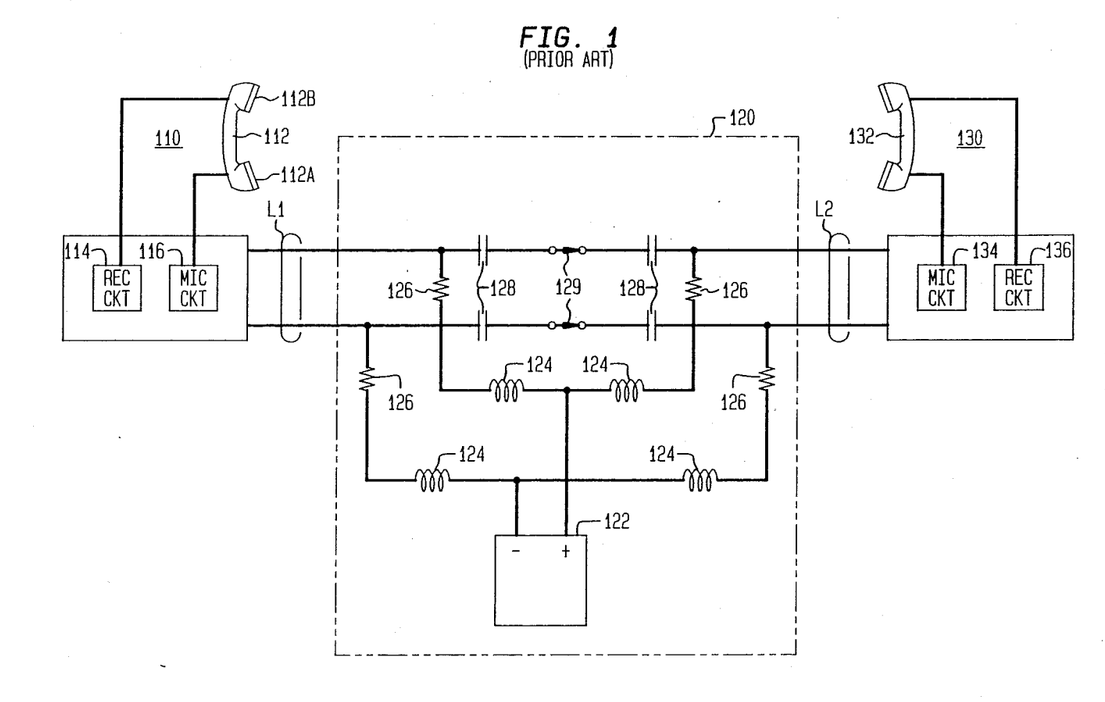
FIG. 1 (prior art) is a simplified block diagram, partially in schematic diagram form, which illustrates a conventional telephone circuit.

To understand the problem more fully, it is helpful to describe the operation of a typical telephone system, shown in simplified form in FIG. 1. This system includes three component parts, a telephone set 110, a switching network 120 and a further telephone set 130. Telephone lines L1 and L2 connect the respective sets 110 and 130 to the switching network 120. The network 120 interconnects these lines to allow voice communication between a first speaker using set 110 and a second speaker using set 130. The lines L1 and L2 are also used to apply operational power to the respective telephone sets 110 and 130.

The simplified telephone set 110 includes three component parts, a handset 112, a receiver circuit 114 and a microphone circuit 116. As set forth below, the switching network 120 maintains substantially constant potentials VL+ and VL− on the two conductors which constitute the telephone line L1. In response to signals provided by a microphone 112A, the microphone circuit 116 modulates current flow through the line L1. This modulated current is applied to the receiver circuit 114 via the line L1. This coupling between the circuits 114 and 116 constitutes the sidetone path. Because of this connection, any signals produced by the microphone are fed to the receiver circuit 114 and applied to the receiver 112b of the handset 112.

The signals generated by the microphone circuit 116 are also applied to the switching network 120. Voice signals are passed from the line L1 to the line L2 via alternating current (AC) coupling capacitors 128. The lines L1 and L2 are electrically connected at the switching network 120 via switches 129. The switching network 120 also applies operational power to the two telephone sets 110 and 120. A battery 122 provides this operational power via a network of power-passing inductors 124 and resistors 126. The inductors 124 have sufficient inductance to prevent the current provided by the battery from interfering with the AC communication signals passed between the telephone sets 110 and 130. The telephone set 130 is identical to the set 110 and, so, is not described in detail.

If the telephone set 110 of the system shown in FIG. 1 were used in a noisy environment, such as may be found in a factory, the background noise would modulate the current on the lines L1 and L2. Although voice signals developed at either of the telephone sets 110 and 130 would be of sufficient amplitude to overcome the background noise, the noise may still be objectionable to users at both ends since it would mask the beginning and ending of words and would unnecessarily tire each listener.

Figure 2:
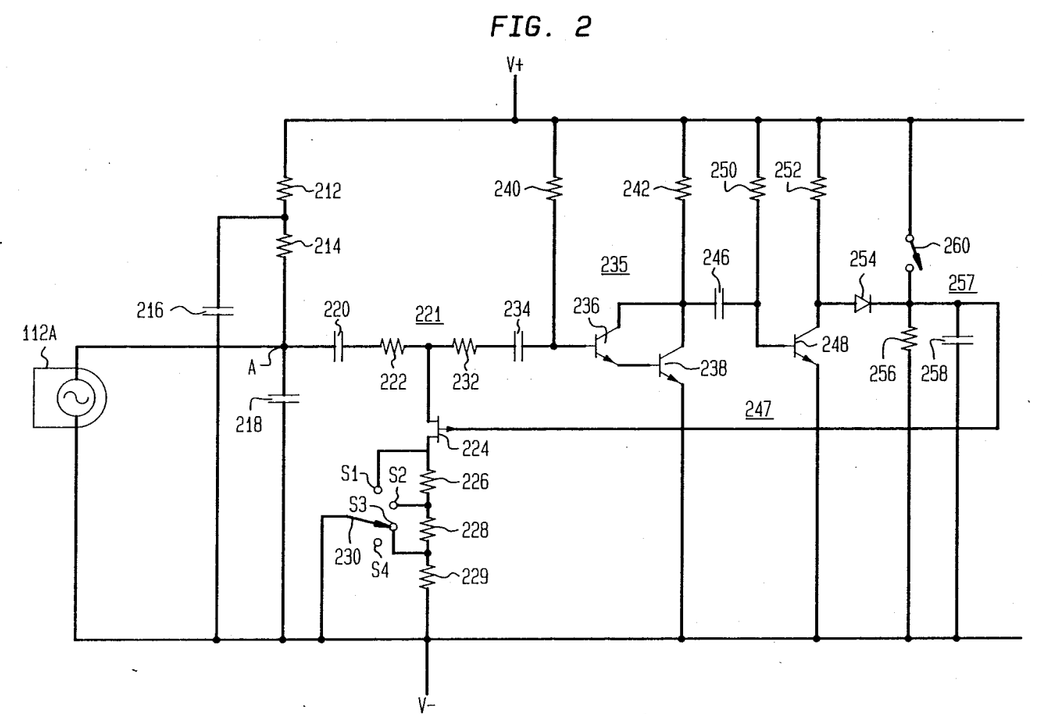
FIG. 2 is a schematic diagram of a signal level expansion circuit which includes an embodiment of the present invention.

The circuitry shown in FIG. 2 is a microphone and a level-sensitive signal level expansion amplifier suitable for use as a portion of either of the microphone circuits 116 or 136. This circuitry essentially replaces the carbon microphone in a conventional telephone device.

As shown in FIG. 2, the circuitry includes the microphone 112A; a voltage divider network 221 including resistors 222, 226, 228 and 229, and a P-channel depletion mode junction field effect transistor (JFET) 224; an amplifier 235 including transistors 236 and 238; a sensor switch 247, including a transistor 248; and a timing circuit 257, including a resistor 256 and a capacitor 258. In general terms, this circuitry operates as follows. Sound pressure is converted by the microphone 112A into electrical signals. These signals are attenuated by the voltage divider network 221 (since the JFET is normally turned on). These attenuated signals are applied to the amplifier 235. The presence of a voice signal is detected by the sensor switch 247 at the output of the amplifier 235. When a voice signal is detected, the switch 247 activates the timing circuit 257. This circuit turns off the JFET 224, greatly increasing the signal level applied to the amplifier 235 by the voltage divider network 221. When the next pause in speech occurs, the timing circuit 257 discharges, the JFET 224 is turned on and the signal level applied to the amplifier 235 is reduced.

The following is a more detailed description of the operation of the circuitry shown in FIG. 2. One terminal of the microphone 112A, which may, for example, be a conventional electret type microphone, is coupled to V− as a source of reference potential. The other terminal is coupled to a junction A of a resistor 214, and capacitors 218 and 220. Signals produced by the microphone 112A are available between the junction A and the reference potential V−.

The electret microphone 112A includes an integral amplifier (not shown). Operational power is provided to this amplifier between the junction A and V− by the resistors 212 and 214. A capacitor 216 is coupled between the interconnection of the resistors 212 and 214 to shunt any AC current modulating the signal V+ to the reference potential V−. This capacitor isolates the integral amplifier of the microphone 112A from the AC communication signal received via the line L1.

The capacitor 218 acts as a low-pass filter, shunting relatively high frequency signals provided by the microphone 112A to the reference potential V−. This capacitor bandlimits the signal provided by the microphone to a band of frequencies (e.g. from approximately 0 Hz to 4 KHz) which may be transmitted by the telephone system.

The capacitor 220 acts as a high-pass filter, since it represents a larger impedance to lower frequency signals than to higher frequency signals. It is well known that many types of background noise have a relatively large portion of their signal energy in relatively low frequency bands, whereas speech signals generally occupy higher frequency bands. Thus, this capacitor acts to enhance the rejection of relatively loud background noises without degrading speech signals.

The capacitor 220 couples the AC signal produced by the microphone 112A at the junction A to the voltage divider network 221. The JFET 224 and the switched resistors 226, 228 and 229 of this network provide an impedance that may be adjusted to change the attenuation of the signal applied to the amplifier 235. When the JFET 224 is turned on (i.e. when there is no voice signal from the microphone 112A), the resistance between its source and drain electrodes is approximately 10 ohms. The resistor 222 used in this embodiment of the invention has a resistance of 1000 ohms and the resistors 226, 228 and 229 are 100 ohms, 330 ohms and 10 K ohms, respectively. So, when the switch 230 is in the S1 position, shorting out the resistors 226, 228 and 230, the attenuation provided by the network is approximately −40 dB. When only the resistors 228 and 229 are shorted, the attenuation is approximately −20 dB; when just the resistor 229 is shorted, the attenuation is approximately −10 dB; and when none of the resistors 226, 228 and 229 is shorted, there is substantially no attenuation of the input signal. The switch position S4 which puts all of the resistors 226, 228 and 229 into the circuit is provided as one of two alternatives for deactivating the signal level expansion circuit. When the JFET 224 is turned off, there is no appreciable attenuation of the signal provided by the microphone 112A via the coupling capacitor 220.

The switch 230 is provided in this embodiment of the invention to reduce a transient popping sound which may occur when the attenuation quickly changes between, for example, −40 dB and 0 dB. This popping sound may not be noticeable in a very noisy environment, such as on a busy street or in a factory, but may be annoying in a less noisy environment such as an automobile. In general, the smaller the step when the attenuation is reduced, the smaller is the popping sound.

The attenuated signal provided by the voltage divider network 221 is applied to the amplifier 235 via a resistor 232 and a capacitor 234. The amplifier 235 includes a pair of transistors 236 and 238 and biasing resistors 240 and 242 configured as a conventional Darlington pair. The resistor 232 and capacitor 234 ensure that the amplifier 235 will not become unstable. In addition, the capacitor 234 prevents biasing degradation of the transistors 236 and 238. The amplifier 235 is coupled to the microphone circuit 116 to send voice signals to the receiver circuit 114 and to the switch network 120.

As set forth above, the amplified signals produced by the amplifier 235 are monitored by a sensor switch 247. The switch 247 includes a transistor 248 which is biased in its saturation region by resistors 250 and 252. That is to say, when there is no voice signal from the microphone 112A, the transistor 248 is turned on. Amplified signals applied to the base of the transistor 248 via the coupling capacitor 246 will condition the transistor 248 to turn off. In this instance, current flows from the source V+ through the resistor 252 and through a diode 254 to charge a capacitor 258. The capacitor 258 is coupled in parallel with a resistor 256 to form the timing circuit 257. The output of the timing circuit 257 is coupled to the gate electrode of the JFET 224. The conductivity of the JFET, and thus the level of attenuation provided by the voltage divider 221 is controlled by the potential developed across the timing circuit 257.

There are significant advantages to detecting the presence of a voice signal at the output of the amplifier 235 rather than at the microphone 112A. For example, because of the filtering performed by the capacitors 218 and 220, the signal level expansion circuitry shown in FIG. 2 may be significantly less sensitive to electromagnetic interference and to loud low frequency noise signals that are out of the voice band than a circuit which develops the switching signal directly from the microphone.

In the timing circuit 257, the value of the resistor 252 is selected so that the capacitor 258 will charge to a potential sufficient to turn off the JFET 224 typically in 12 milliseconds (ms). The time constant of the timing circuit 257 ensures that the JFET 224 will remain turned off for approximately 150 ms in response to a detected speech signal This time constant keeps the signal applied to the amplifier 235 unattenuated through brief pauses between spoken words so that the reproduced voice signal does not sound broken or choppy A switch 260 is included to allow a user to totally disable the signal level expanding feature of the circuit. When the switch 260 is closed, the capacitor 258 is continuously charged, so the JFET is held in a turned-off state. It may be desirable to turn off the expanding feature when the phone is used in a quiet environment and even the relatively mute pop caused by the switch between −10 dB and 0 dB of attenuation is noticeable.

As described above in reference to the resistor 229 of FIG. 2, an alternative method for disabling the signal level expander is to increase the resistance in the take-off leg of the voltage divider circuit 221 so that the change in resistance of the JFET 224 has a negligible effect on the amount of attenuation provided by the voltage divider. Thus, the switch position S4 provides an alternative to the switch 260 for turning off the gain expander If the switch 260 is included in the circuit, the resistor 229 and switch position S3 may be eliminated from the circuit shown in FIG. 2.

A level expander circuit suitable for use in a telephone system has been described. This circuit substantially eliminates background noise in the pauses of a telephone conversation without significantly affecting the spoken words that constitute a telephone conversation.

To adapt this circuit to other applications such as the VOX system or the squelch systems referred to above, components specific to this application, such as the microphone 112A, the resistors 212 and 214 and the capacitor 216 would be removed, the values of the other capacitors would be changed to be consistent with the operational frequencies of the new application, and transistors having suitable switching speeds would be substituted for the ones shown in FIG. 2.

As set forth above, the use of electret microphones instead of more directional carbon microphones has increased the susceptibility of telephone devices to interference caused by background noise. This interference occurs during spoken words as well as in the pauses between spoken words. While the circuitry set forth above reduces the level of background interference during conversational pauses, it does not reduce the level of background noise that may interfere with spoken words. One method to reduce the level of this type of interference is to increase the directionality of the electret microphone.

Figure 3:
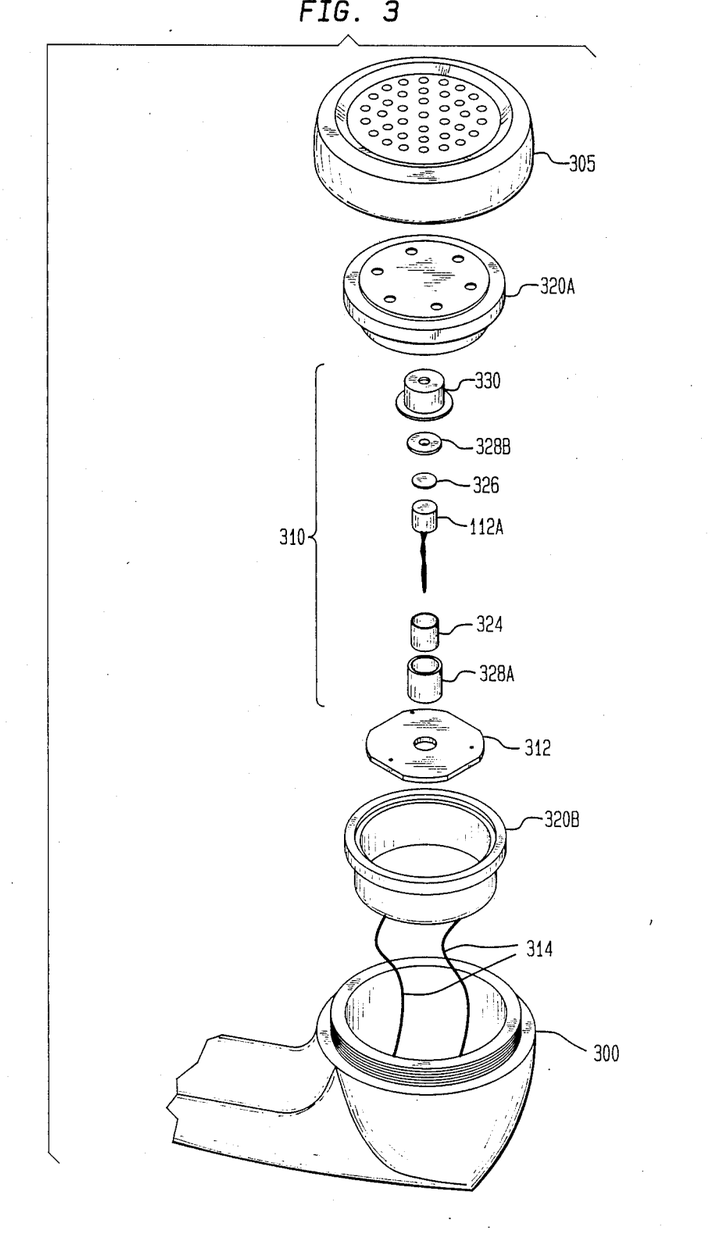
FIG. 3 is a perspective drawing of telephone handset/showing the positioning of the microphone.
Figure 4A:
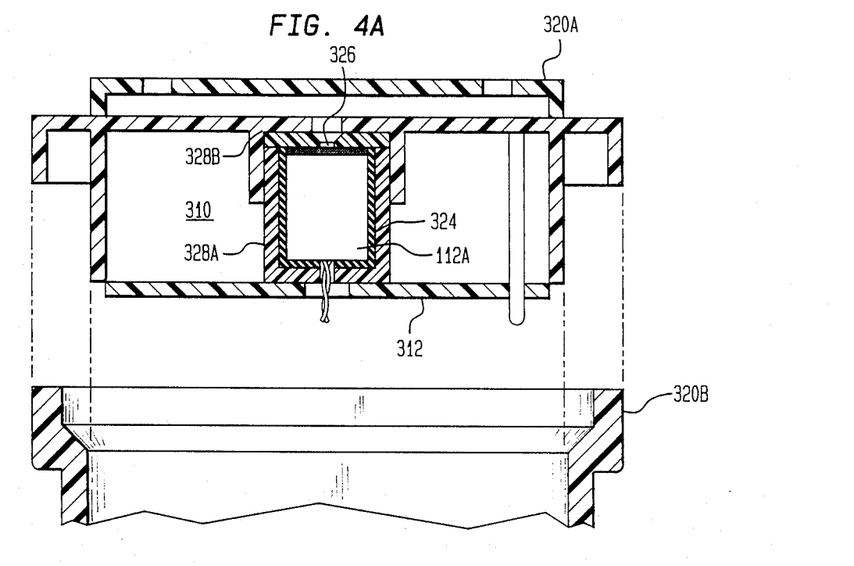
FIGS. 4A and 4B are side plan drawings which illustrate alternative mounting structures used for the microphone.
Figure 4B:
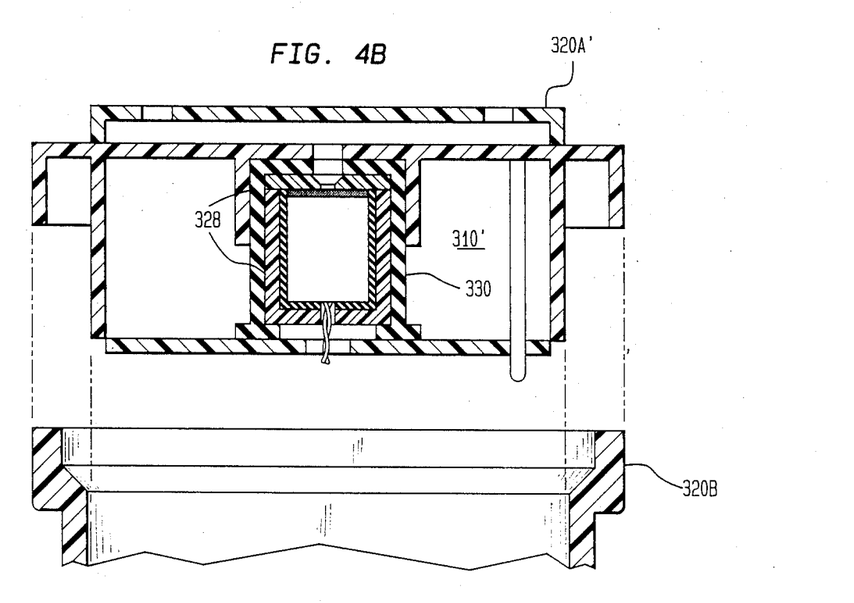

FIGS. 3, 4A and 4B show microphone mounting apparatus which tends to increase the directionality of a conventional electret microphone so that the telephone device is more sensitive to words spoken into the mouthpiece of the handset than to extraneous background noises.

FIG. 3 is a blown-up perspective drawing which illustrates the construction of the handset. The microphone assembly 310, which is described below in reference to FIGS. 4A and 4B, includes a conventional electret microphone 112A enclosed in a rubber boot 324 and a hard plastic or metal can 328. The microphone assembly 310 is mounted on a printed circuit board 312 which is electrically coupled to the microphone circuit 116 of the telephone device by wires 314. The combined microphone assembly 310 and printed circuit board 312 are mounted within a capsule 320 which includes a capsule top 320A and a capsule bottom 320B. The capsule 320 fits into the handset 300 as shown and is secured by the mouthpiece 305.

FIGS. 4A and 4B are cut-away views of the capsule which illustrate alternative constructions of the microphone assembly 310 as well as the mounting of the assembly in the capsule 320.

In FIG. 4A, the bottom and sides of the electret microphone 112A are enclosed in a pliable rubber boot 324; a cloth disc 326 covers the top. The boot 324, may be made of a variety of pliable plastic or rubber materials and may have an arbitrary thickness. The boot 324 tends to insulate the microphone 112A from physical vibrations and to provide an inter-surface barrier which tends to reflect sound. The cloth disc 326 does not form as effective an intersurface barrier as the boot 324 due to its porousness.

The microphone 112A, rubber boot 324 and cloth disc 326 are enclosed in a can 328. This combination forms one embodiment of the microphone assembly 310 described above in reference to FIG. 3. The can 328 includes a bottom part 328a, which is a molded enclosure in the form of a closed cylinder, and a top part 328b which is in the form of a disc with a central hole. The top and bottom parts of the can 328 may be made of any of a number of hard, relatively heavy materials such as metal or a molding plastic providing a relatively high inertial mass and thus having good sound damping characteristics.

The can 328 provides additional acoustic isolation for the sides and bottom of the microphone by its sound damping characteristics and because of the inter-surface barrier between the can 328 and the boot 324. Due to this barrier and the similar barrier between the boot 324 and the microphone 112A, the enclosure tends to transmit only a portion of the incident sound energy to the microphone 112A. the remaining energy is reflected away from the microphone. The top part, 328b, of the can 328 includes a centered hole having sloped sides, such that the angle formed by the sides is substantially equal to 90°. This hole provides relatively unimpeded access for sound waves incident on the top of the can 328.

The microphone assembly 310 is attached to a circuit board 312 which may include some or all of the components of the level expander circuit described above. This microphone assembly fits snugly into the capsule top 320A and the circuit board 312, which holds the microphone assembly 310, is rigidly affixed to the capsule top 320A by three plastic printed circuit mounting pins. One of these pins, 332, is shown in FIG. 4A. The capsule top 320A is configured to fit snugly within the capsule bottom 320B to form the capsule 320.

An alternative embodiment of a modified microphone assembly 310' and capsule top 320A' is shown in FIG. 4B. The microphone assembly 310' differs from that shown in FIG. 4A only in the addition of an outer rubber boot, 330, surrounding the sides of the can 328. This rubber boot provides additional sound damping due to its resiliency and due to the intersurface barrier formed between the boot 330 and the can 328. The capsule top 320A' is modified as shown in FIG. 4B to engage the outer boot 330 of the modified microphone assembly 310'.

In addition to providing acoustic damping for sounds emanating from anywhere but directly above the microphone 112A, the rubber boots 324 and 330 provide electrical insulation for the electret microphone 112A which improves the performance of the microphone in conditions where relatively high levels of static electricity may be found.

It is contemplated that this structure may be simplified by placing the microphone 112A in a rubber boot and then affixing the combination to a mass (i.e. a mounting part) to provide the microphone with sufficient inertial mass to improve its directivity.

The following is a table of values for components used in the exemplary circuitry shown in FIG. 2.

TABLE

| Capacitors: | 216 | 33 microfarads |
|---|---|---|
| | 218, 220, 234, 246 | 0.22 microfarad |
| | 258 | 0.022 microfarad |
| Resistors: | 212, 228 | 330 ohms |
| | 229 | 10K ohms |
| | 214 | 820 ohms |
| | 222, 232 | 1K ohms |
| | 226 | 100 ohms |
| | 240 | 1M ohms |
| | 242 | 15 ohms |
| | 250 | 750K ohms |
| | 252 | 47K ohms |
| | 256 | 3.3M ohms |
| Transistors: | 224 | J177 |
| | 236 & 238 | MPSW14 |
| | 248 | KTC 9013A |
| Microphone 112A | | CMT 62 Mfd by BSE Co. Ltd. |

While the invention has been described in terms of exemplary embodiments, it is contemplated that it may be practiced as outlined above with modifications within the spirit and scope of the appended claims.

The invention claims is:

1. A signal level expansion system comprising:
    means for applying an input signal;
    variable attenuator means, coupled to receive said input signal and responsive to a control signal, for providing an output signal representing a reduced-amplitude version of said input signal;
    amplifier means, coupled to said variable attenuator means for amplifying the signal provided thereby;
    signal detection means, coupled to said amplifier means and responsive to the amplitude of the signals provided thereby for generating said control signal including:
        a switch, coupled to said amplifier means, to a source of operating potential and to a source of reference potential and biased to establish a conduction path between said source of operating potential and said source of reference potential, wherein said switch is responsive to the amplitude of the signal provided by said amplifier means being above a threshold value for increasing the impedance of the conduction path between the source of operating potential and the source of reference potential; and
        means, coupled to said switch, for generating said control signal, said generated control signal being in a state which acts to decrease the level of attenuation provided by the variable attenuation means when the switch exhibits said increased impedance.

2. The signal level expansion system set forth in claim 1, wherein:
    said variable attenuator means includes:
        resistance means, having first and second terminals and coupled to receive said input signal at said first terminal; and
        variable conduction means having a principal conduction path between first and second electrodes the conductivity of said principal conduction path being controlled in response to a signal applied to a third electrode, said first electrode being coupled to the second terminal of said resistance means and said second electrode being coupled to a source of reference potential;
    wherein the output signal of said variable attenuator means is taken between the first electrode of said variable conduction means and said source of reference potential.

3. The signal level expansion system set forth in claim 2 wherein said means for generating said control signal further includes timing means, coupled to said switch for holding said control signal in the state which acts to decrease the level of attenuation provided by said variable attenuator means for a predetermined time interval.

4. The signal level expansion system set forth in claim 3 wherein said switch includes:
    variable conduction means having a principal conduction path between respective first and second electrodes, the conductivity of the principal conduction path of the variable conduction means of said switch being controlled by signals applied to a third electrode;
    means for applying a biasing signal to the third electrode of the variable conduction means of said switch said biasing signal having the effect of reducing the impedance of the principal conduction path of the variable conduction means of said switch relative to the impedance which would exist if no signal were applied to the third electrode; and
    means for applying the signal provided by said amplifier means to the third electrode of said switch to increase the impedance of the principal conduction path of the variable conduction means of said switch when the amplitude of the signal provided by said amplifier means is greater than said threshold value.

5. The signal level expansion system set forth in claim 4 wherein said means for generating said control signal includes unidirectional conduction means, coupled between the first electrode of said switch and said timing means for providing current to said timing means when said the principal conduction path of the variable conduction means of said switch has said increased impedance and for blocking current flow from said timing means when the principal conduction path of the variable conduction means of said switch has said reduced impedance.

6. The signal level expansion system set forth in claim 5 wherein said timing means includes a capacitor and a resistor coupled in parallel between said unidirectional conduction means and said source of reference potential and the junction of the unidirectional conduction means and the timing means is further connected to the third electrode of the variable conduction means of said variable attenuator means to effectively control the conductivity of the principal conduction path of the variable conduction means of said variable attenuator means.

7. The signal level expansion system set forth in claim 3, further including feature switching means, coupled between said source of operating potential and said timing means, for forcing said control signal to be in said the state which decreases the level of attenuation provided by said variable attenuator means to selectively disable said variable attenuator means.

8. The signal level expansion system set forth in claim 2 wherein said variable attenuator means further includes further resistance means coupled between the second terminal of the variable conduction means of said variable attenuator means and said source of reference potential, said further resistance means having a first terminal coupled to the second terminal of said variable conduction means and a second terminal coupled to said source of reference potential; and
  attenuation control switching means having a first terminal coupled to the second terminal of said variable conduction means and a second terminal coupled to said source of reference potential, said attenuation control switching means being operable to change the level of attenuation provided by said variable attenuator means in response to said control signal.

9. The signal level expansion system set forth in claim 1 wherein said means for applying an input signal includes a microphone having a top portion for receiving sound energy and a side portion, wherein said microphone is enclosed in a casing which tends to attenuate sound signals incident on said side portion to a greater degree than sound signals incident on said top portion.

10. The signal level expansion system set forth in claim 9 wherein said casing includes:
  a pliant boot enclosing at least the side portion of said microphone;
  a rigid can having a top portion with a central opening, a side portion and a bottom portion, said can being configured to enclose the microphone and said pliant boot such that the top portion of said microphone is beneath the top portion of said can.

11. The signal level expansion system set forth in claim 10, wherein said casing further includes a further pliant boot enclosing at least the side portion of said can.

12. A signal level expansion system comprising:
means for applying an input signal;
variable attenuator means, coupled to receive said input signal and responsive to a control signal, for providing an output signal representing a reduced-amplitude version of said input signal, said variable attenuator means including:
  resistance means, having first and second terminals and coupled to receive said input signal at said first terminal; and
  variable conduction means having a principle conduction path between first and second electrodes the conductivity of said principle conduction path being controlled in response to said control signal applied to a third electrode, said first electrode being coupled to the second terminal of said resistance means and said second electrode being coupled to a source of reference potential;
  wherein the output signal of said variable attenuator means is taken between the first electrode of said variable conduction means and said source of reference potential; and
amplifier means, coupled to said variable attenuator means for amplifying the signal provided thereby;
signal detection means, coupled to said amplifier means and responsive to the amplitude of the signals provided thereby for generating said control signal which acts to decrease the level of attenuation provided by the variable attenuator means in response to an increase in the amplitude of the signal provided by the amplifier means, said signal detection means including:
  switch means, coupled to receive the signal provided by said amplifier means, for generating said control signal that is in a first state and a second state when the amplitude of the signal provided by said amplifier is respectively less than and greater than a threshold value; and
  timing means, coupled to said switch means for holding said control signal in said second state for a predetermined time interval; and
feature switching means, coupled between a source of operating potential and said timing means for forcing said control signal to be in said second state to selectively disable said variable attenuation means.

13. A signal level expansion system comprising:
means for applying an input signal;
variable attenuator means, coupled to receive said input signal and responsive to a control signal, for providing an output signal representing a reduced-amplitude version of said input signal, said variable attenuator means including:
  first and second resistance means, each having first and second terminals, said first resistance means coupled to receive said input signal at said first terminal;
  variable conduction means having a principle conduction path between first and second electrodes the conductivity of said principle conduction path being controlled in response to said control signal applied to a third electrode, said first electrode being coupled to the second terminal of said first resistance means and said second electrode being coupled to the first electrode of said second resistance means, wherein the second electrode of said second resistance is coupled to a source of reference potential; and attenuation control switching means having a first terminal coupled to the second terminal of said variable conduction means and a second terminal coupled to said source of reference potential, said attenuation control switching means being operable to change the level of attenuation provided by said variable attenuator means in response to said control signal;

wherein the output signal of said variable attenuator means is taken between the first electrode of said variable conduction means and said source of reference potential; and amplifier means, coupled to said variable attenuator means for amplifying the signal provided thereby;

signal detection means, coupled to said amplifier means and responsive to the amplitude of the signals provided thereby for generating said control signal which acts to decrease the level of attenuation provided by the variable attenuator means in response to an increase in the amplitude of the signal provided by the amplifier means, said signal detection means including switch means, coupled to receive the single provided by said amplifier means, for generating said control signal that is in a first state and a second state when the amplitude of the signal provided by the amplifier is respectively less than and greater than a threshold value.

* * * * *